(12) United States Patent
Ikuta

(10) Patent No.: US 9,929,538 B2
(45) Date of Patent: Mar. 27, 2018

(54) SURFACE EMITTING LASER AND IMAGE FORMING APPARATUS

(75) Inventor: Mitsuhiro Ikuta, Cambridge, MA (US)

(73) Assignee: CANON KABUSHIKI KAISHA, Tokyo (JP)

( * ) Notice: Subject to any disclaimer, the term of this patent is extended or adjusted under 35 U.S.C. 154(b) by 908 days.

(21) Appl. No.: 13/608,061

(22) Filed: Sep. 10, 2012

(65) Prior Publication Data

US 2013/0076849 A1 Mar. 28, 2013

(30) Foreign Application Priority Data

Sep. 28, 2011 (JP) .................. 2011-212969

(51) Int. Cl.
| | |
|---|---|
| *H01S 5/183* | (2006.01) |
| *B41J 2/47* | (2006.01) |
| *B82Y 20/00* | (2011.01) |
| *H01S 5/343* | (2006.01) |

(52) U.S. Cl.
CPC .......... *H01S 5/18386* (2013.01); *B41J 2/471* (2013.01); *B82Y 20/00* (2013.01); *H01S 5/18344* (2013.01); *H01S 5/18391* (2013.01); *H01S 5/18311* (2013.01); *H01S 5/34326* (2013.01); *H01S 2301/166* (2013.01); *H01S 2301/176* (2013.01); *H01S 2301/18* (2013.01)

(58) Field of Classification Search
CPC ............. H01S 5/18311; H01S 5/18347; H01S 5/18369; H01S 5/18377; H01S 5/18391
See application file for complete search history.

(56) References Cited

U.S. PATENT DOCUMENTS

| | | | |
|---|---|---|---|
| 2010/0027578 A1 | 2/2010 | Takeuchi | |
| 2012/0086765 A1* | 4/2012 | Higashi et al. | 347/248 |
| 2012/0294652 A1* | 11/2012 | Itoh et al. | 399/177 |

FOREIGN PATENT DOCUMENTS

| | | |
|---|---|---|
| CN | 101394064 A | 3/2009 |
| JP | 2001-284722 A | 10/2001 |
| JP | 2011-014869 A | 1/2011 |
| JP | 2012-009727 A | 1/2012 |

\* cited by examiner

*Primary Examiner* — Kristal Feggins
*Assistant Examiner* — Kendrick Liu
(74) *Attorney, Agent, or Firm* — Canon USA, Inc., IP Division

(57) ABSTRACT

A first stepped structure configured to apply a reflectance difference and a second stepped structure configured to change a far field light intensity distribution are provided. A region in which a level difference of the first stepped structure is formed has a predetermined relationship with a region in which a level difference of the second stepped structure is formed.

13 Claims, 9 Drawing Sheets

SURFACE EMITTING LASER AND IMAGE FORMING APPARATUS

BACKGROUND OF THE INVENTION

Field of the Invention

The present invention relates to a surface emitting laser and an image forming apparatus using the surface emitting laser.

Description of the Related Art

A vertical cavity surface emitting laser (VCSEL) is utilized as a light source of a scanning optical device in an electrophotographic image forming apparatus. In this kind of scanning optical device, outgoing light from a light source is shaped by a diaphragm. The outgoing light is irradiated to a photoreceptor which is a scanned surface by an optical deflector (for example, a polygon mirror), to form a latent image.

When the surface emitting laser is utilized as the light source of the image forming apparatus, the surface emitting laser is desirably oscillated in only a basic transverse mode from the viewpoint of the monomodality and stability of the latent image in the photoreceptor. Japanese Patent Application Laid-Open No. 2001-284722 discusses a technique of oscillating a surface emitting laser in a single transverse mode by providing a stepped structure on the light outgoing surface of the surface emitting laser. The stepped structure is constituted so that the reflectance of the center portion of a light emitting region is higher than that of the peripheral portion. Because light intensity is distributed in the center portion in the fundamental transverse mode compared with a high order transverse mode, light in the fundamental transverse mode can be selectively oscillated by providing the stepped structure.

The stepped structure of Japanese Patent Application Laid-Open No. 2001-284722 is characterized that the reflectance in the center portion of the light emitting region is different from that in the peripheral portion. When the stepped structure is provided, the transmittance of light in the center portion of the light emitting region is different from that in the peripheral portion thereof in addition to the reflectance. A light path length difference in the center portion of the light emitting region is different from that in the peripheral portion thereof.

In the stepped structure in which the reflectance of the center portion is higher than that of the peripheral portion, the intensity of laser light transmitted from the peripheral portion is higher than that in the case where the stepped structure does not exist. The phase of light transmitted through the peripheral portion is different from the phase of light transmitted through the center portion. As a result, a near field light intensity distribution approaches to an annular form.

FIG. 9 illustrates a far field light intensity distribution corresponding to the near field light intensity distribution. Compared with a far field light intensity distribution 920 when the stepped structure is not provided, in a far field light intensity distribution 910 when the stepped structure is provided, the half value width of the far field light intensity distribution at the center of a divergence angle (example: −5 degrees to +5 degrees) is thinned. When the surface emitting laser is used as the light source of the image forming apparatus, accuracy required for the angle of the surface emitting laser attached to a scanning optical system of the image forming apparatus (axial alignment of an outgoing surface normal line of the light source and an optical axis of an optical system) is severer. Therefore, it is not desirable that the surface emitting laser is used.

SUMMARY OF THE INVENTION

The present invention is directed to a surface emitting laser including a stepped structure provided to perform reflectance control for transverse mode control and having an improved divergence angle of a far field light intensity distribution, and an image forming apparatus using the surface emitting laser.

According to an aspect of the present invention, a surface emitting laser including a laminated structure including a substrate, and a lower mirror, an active layer, and an upper mirror formed on the substrate configured to oscillate at a wavelength $\lambda$ includes a first stepped structure provided in a light outgoing region on an upper part of the upper mirror and including a level difference formed between a first region arranged in a center portion of the light outgoing region and a second region provided outside the first region, and a second stepped structure provided in the light outgoing region on the upper part of the upper mirror and including a level difference formed between a third region provided outside the first region and a fourth region provided outside the third region, wherein the level difference of the second stepped structure exists in the second region, reflectance of a structure including the upper mirror, the first stepped structure, and the second stepped structure in the first region is higher than that in the second region with respect to light perpendicularly made incident to the substrate and having a wavelength $\lambda$, and a phase difference between transmitted light of the third region and transmitted light of the fourth region is larger than a phase difference between transmitted light of the first region and transmitted light of the third region.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Figure 1:
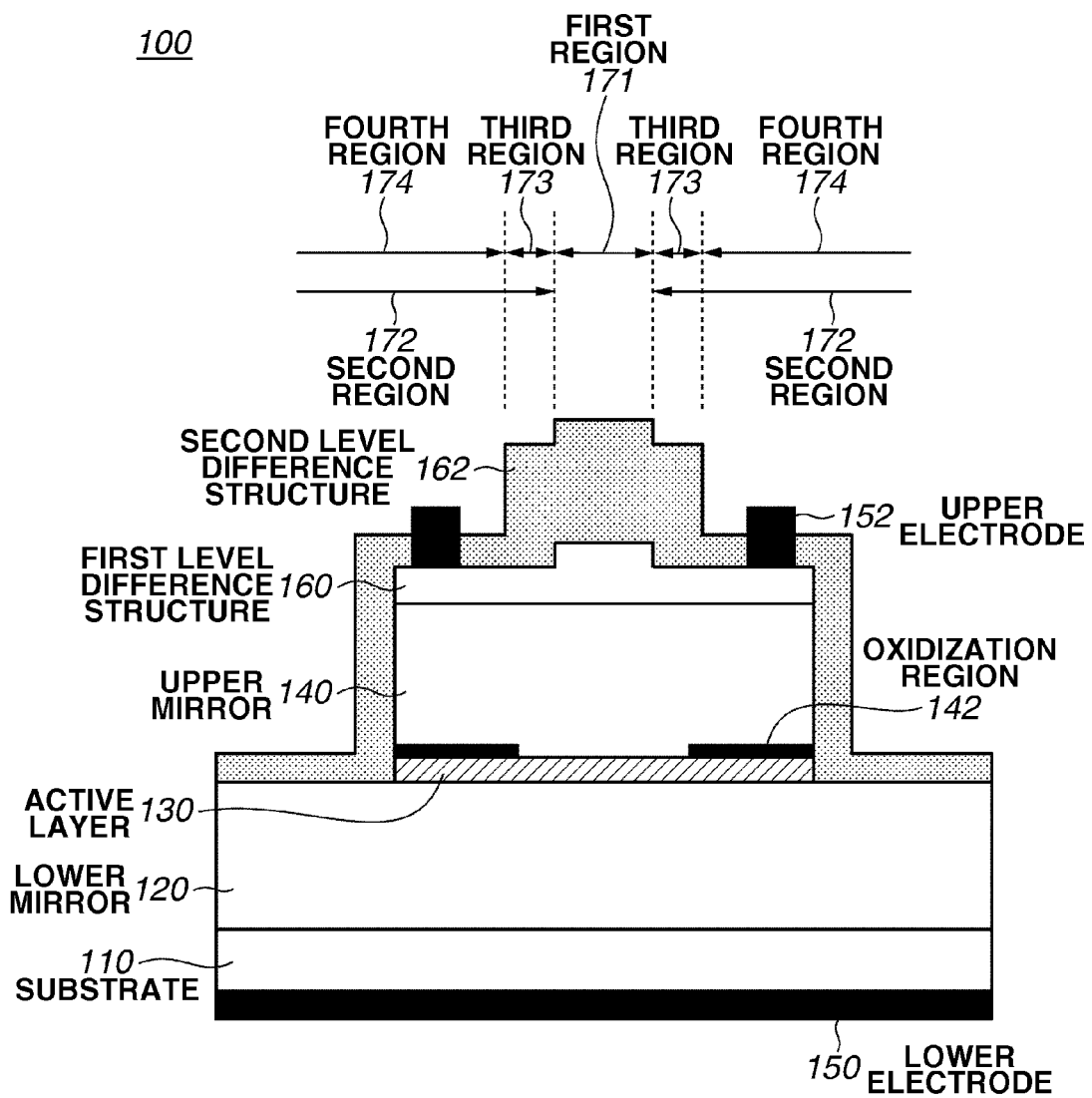
FIG. 1 is a schematic cross sectional view of a surface emitting laser according to a first exemplary embodiment.

Various exemplary embodiments, features, and aspects of the invention will be described in detail below with reference to the drawings.

In a surface emitting laser according to an embodiment of the present invention, in addition to a stepped structure (first stepped structure) configured to apply a reflectance difference, a stepped structure (second stepped structure) configured to change a far field light intensity distribution is provided in a low reflectance region of the first stepped structure.

In the first stepped structure, a light outgoing region is divided into a first region and a second region by the boundary of the level difference thereof. For example, the first region is located in the center portion of the light outgoing region. The second region is provided in a peripheral portion which is outside the first region. Because of transverse mode control, the reflectance of the first region is higher than that of the second region.

A first material included in the first stepped structure includes a material through which at least a part of light having an oscillation wavelength $\lambda$ is transmitted. For example, the optical thickness of the first stepped structure is $\lambda/2$ in the first region, and is $\lambda/4$ in the second region. When the difference between the optical thickness of the first region and the optical thickness of the second region is an odd multiple of $\lambda/4$, the reflectance difference between the two regions is increased. When the difference between the optical thicknesses is smaller, from the viewpoint of controllability of the reflectance, the first stepped structure can be produced with a high degree of accuracy. Thereby, the difference between the optical thicknesses can be $\lambda/4$.

The second stepped structure is arranged on an upper part of an upper mirror and the first stepped structure, or between the upper mirror and the first stepped structure. A second material included in the second stepped structure includes a material through which at least apart of light having an oscillation wavelength $\lambda$ is transmitted. This is because it is necessary to make transmitted light having a different phase, which is applied by a light path length difference of the second stepped structure, interfere in a far visual field in order to improve a divergence angle of the far field light intensity distribution.

The second material is constituted such that a refractive index in an oscillation wavelength $\lambda$ is different from that of the first material included in the first stepped structure. This is because the function of the first stepped structure is separated from the function of the second stepped structure. For example, when the first material includes a semiconductor, the second material includes a dielectric material.

As described above, the reflectance can be controlled by providing the first stepped structure. However, the half value width of the visual field light intensity distribution is thinned. Consequently, in order to compensate the visual field light intensity distribution, the second stepped structure is constituted so that a phase difference is applied to the transmitted light compared with the first stepped structure. When the term "region" is used, this can be described as "the phase difference between the transmitted light of a third region and the transmitted light of a fourth region is greater than the phase difference between the transmitted light of the first region and the transmitted light of the third region".

The phase difference (radian) applied by the second stepped structure in a near visual field under scalar diffraction approximation is almost equal to a value obtained by dividing a value, which is obtained by subtracting an actual thickness of the level difference from an optical thickness of a level difference, by $\lambda$. Consequently, the absolute value of a value obtained by subtracting "the actual thickness (the thickness without considering a refractive index) difference" of the level difference of the second stepped structure from the "light path length difference" thereof is greater than an absolute value of a value obtained by subtracting "the actual thickness difference" of the level difference of the first stepped structure from the "light path length difference" thereof. Thereby, because the second stepped structure can apply the phase difference to the transmitted light compared with the first stepped structure in the near visual field, distortion having a large wave surface can be applied, and the far visual field light intensity distribution can be greatly deformed. When the term "region" is used, this can be described as "the absolute value of the value obtained by subtracting the actual thickness difference between the third region and the fourth region from the light path length difference therebetween is greater than the absolute value of the value obtained by subtracting the actual thickness difference between the first region and the third region from the light path length difference therebetween".

When the phase difference between the transmitted lights inside and outside the boundary of the level difference of the second stepped structure is set to be greater than $\pi/2$, the interference of both the transmitted lights is increased, which can greatly deform the far visual field light intensity distribution. In order to further widen the half value width of the far visual field light intensity distribution, the phase difference between the transmitted lights inside and outside the boundary of the level difference of the second stepped structure is advantageously brought close to $\pi$. Specifically, the phase difference between the transmitted light of the third region of the second stepped structure and the transmitted light of the fourth region is advantageously brought close to $\pi$. Consequently, the phase difference between the transmitted light of the third region and the transmitted light of the fourth region may be brought close to $\pi$ compared with the phase difference between the transmitted light of the first region and the transmitted light of the third region.

A first exemplary embodiment will be described. FIG. 1 is a schematic cross sectional view of a surface emitting laser 100 according to the present invention.

The surface emitting laser 100 has a laminated structure in which a lower mirror 120, an active layer 130, and upper mirror 140 are laminated on a substrate 110.

The upper mirror 140 and the active layer 130 are partially etched to form a cylindrical mesa structure having a diameter of, for example, 30 μm.

For example, the substrate 110 is a GaAs substrate doped into an n-type and having a thickness of 600 μm.

The lower mirror 120 includes $Al_{0.5}Ga_{0.5}As$/AlAs doped into an n-type. The lower mirror 120 is a multilayer film reflector obtained by alternately laminating respective materials by an optical thickness of $\lambda/4$ to include 60 pairs of $Al_{0.5}Ga_{0.5}As$ and AlAs.

The active layer 130 has a thickness adjusted so that a resonant wavelength is set to λ. For example, the active layer 130 includes a multiple quantum well structure and a clad layer. The total optical thickness of the multiple quantum well structure and the clad layer is 2λ. The multiple quantum well structure is placed in the antinode of a resonator, and includes GaInP/AlGaInP. The clad layer includes AlGaInP.

The upper mirror 140 includes $Al_{0.5}Ga_{0.5}As/Al_{0.9}Ga_{0.1}As$ doped into a p-type. The upper mirror 140 is a multilayer film reflector obtained by alternately laminating respective materials by an optical thickness of λ/4 to include 34 pairs of $Al_{0.5}Ga_{0.5}As$ and $Al_{0.9}Ga_{0.1}As$. A part of $Al_{0.9}Ga_{0.1}As$ of the upper mirror 140 on a side close to the active layer 130 includes $Al_{0.98}Ga_{0.02}As$. The side surface of the mesa structure is oxidized, which is an oxidization region 142. The oxidization region 142 forms a current confinement structure, and forms a circular current confinement structure having a diameter of, for example, 5 µm.

A first stepped structure 160 including a semiconductor is formed in a light outgoing region on the upper mirror 140. The first stepped structure 160 has a level difference formed between a first region 171 located in a center portion of a light emitting region and a second region 172 located in a peripheral part thereof. The boundary between the first region 171 and the second region 172 is constituted by a circle having a diameter of, for example, 4 µm.

A second stepped structure 162 including a dielectric material is formed on the first stepped structure 160. The second stepped structure 162 has a level difference formed between a third region 173 and a fourth region 174.

The boundary between the third region 173 and the fourth region 174 exists in the second region 172. The boundary is a circle having a diameter of, for example, 4.5 µm. For example, the centers of the oxidization region 142, the first stepped structure 160, and the second stepped structure 162 are coaxial.

A first material included in the first stepped structure 160 has a refractive index higher than that of a second material included in the second stepped structure 162. For example, the refractive index of the first material is 2.5 to 4.0, and the refractive index of the second material is 1.0 to 2.5.

A dielectric material film as a protective film may be formed on the side wall and the bottom surface of the mesa structure. The dielectric material film may include the same material as that of the second stepped structure.

An upper electrode 152 is provided so as to be brought into contact with the upper mirror 140 or the first stepped structure 160. The upper electrode 152 includes, for example, Ti/Au (a thickness of 50 nm/1000 nm).

The upper electrode 152 has an opening wider than the boundary between the third region 173 and the fourth region 174 of the second stepped structure 162. It is advantageous that the upper electrode 152 does not exist on the light emitting region to suppress output degradation.

A lower electrode 150 is provided so as to be brought into contact with the substrate 110. The lower electrode 150 includes, for example, AuGe/Ni/Au (a thickness of 150 nm/30 nm/200 nm).

Carriers are injected into the active layer 130 by applying a voltage to the upper electrode 152 and the lower electrode 150. Thereby, the light emitting region emits light, which results in the oscillation of the surface emitting laser 100.

The shape example of the first stepped structure 160 is illustrated in FIG. 2. In each case of FIGS. 2A to 2D, in the whole structure including the upper mirror 140, the first stepped structure 160, and the second stepped structure 162, with respect to the light perpendicularly made incident and having a wavelength λ, the reflectance is higher in the center portion of the structure than in the peripheral portion.

The first stepped structure 160 may be a convex type or a concave type.

Figure 2A:
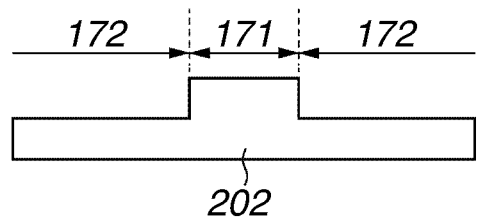
FIGS. 2A, 2B, 2C, and 2D are schematic cross sectional views of a first stepped structure included in the surface emitting laser according to the first exemplary embodiment.

FIG. 2A illustrates a convex type stepped structure. For example, the optical thickness of an $Al_{0.5}Ga_{0.5}As$ layer 202 is λ/2 in the first region 171 (center portion), and is λ/4 in the second region 172 (peripheral portion).

Figure 2B:
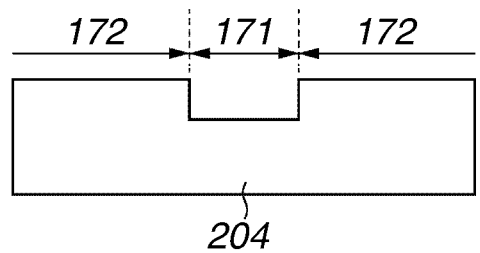

FIG. 2B shows a concave type stepped structure. For example, the optical thickness of an $Al_{0.5}Ga_{0.5}As$ layer 204 is λ/2 in the first region 171 (center portion), and is 3λ/4 in the second region 172 (peripheral portion).

Figure 2C:
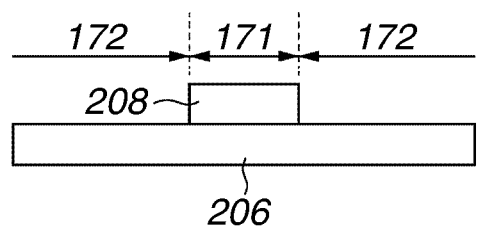
Figure 2D:
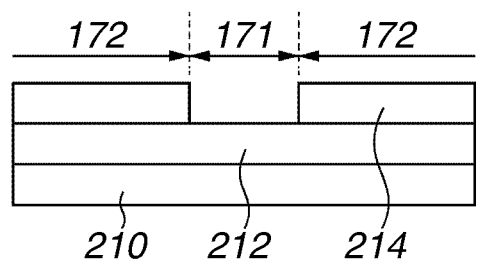

The first stepped structure 160 may include a plurality of materials as illustrated in FIGS. 2C and 2D.

In FIG. 2C, the second region 172 includes an $Al_{0.9}Ga_{0.1}As$ layer 206 having a thickness of λ/4. However, the first region 171 includes the $Al_{0.9}Ga_{0.1}As$ layer 206 and an $Al_{0.5}Ga_{0.5}As$ layer 208 having a thickness of λ/4.

In FIG. 2D, the first region 171 includes an $Al_{0.9}Ga_{0.1}As$ layer 210 having a thickness of λ/4 and an $Al_{0.5}Ga_{0.5}As$ layer 212 having a thickness of λ/4. On the other hand, the second region 172 includes an $Al_{0.9}Ga_{0.1}As$ layer 214 formed on an upper part of the above layers and having a thickness of λ/4.

Thus, the first stepped structure 160 includes the plurality of materials, and thereby the reflectance difference between the first region 171 and the second region 172 can be increased compared with that in the case of a single material.

In FIG. 1, the second stepped structure 162 is a stepped structure in which the optical thickness of the third region 173 is different from that of the fourth region 174. The third region 173 is located inside the fourth region 174. The boundary between the third region 173 and the fourth region 174 is located in the second region 172. The first stepped structure 160 is provided for reflectance control, and the light is not far emitted from the first region 171 which is a high reflectance region. Therefore, it is necessary to provide the level difference (the boundary between the third region 173 and the fourth region 174) of the second stepped structure configured to apply a desired phase difference to transmitted light in the second region 172 which is a low reflectance region.

The optical thickness of the second stepped structure 162 in the first region 171 is set to be the same as that of the third region 173, for example.

Figure 3A:
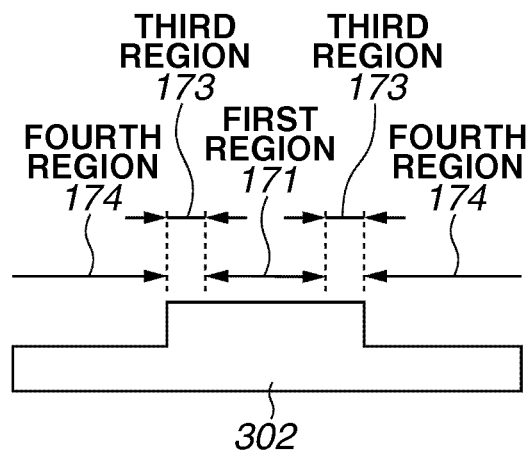
FIGS. 3A and 3B are schematic cross sectional views of a second stepped structure included in the surface emitting laser according to the first exemplary embodiment.
Figure 3B:
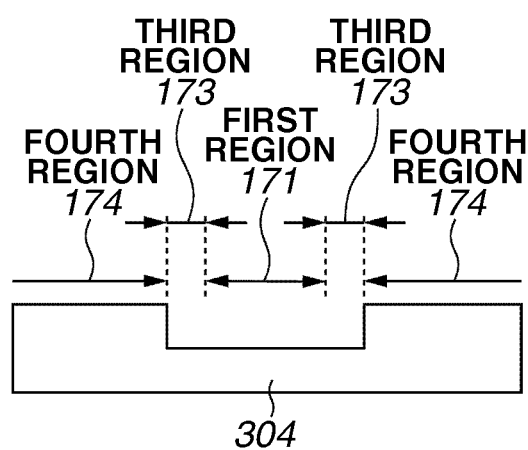

FIGS. 3A and 3B are schematic views illustrating the optical thickness of the second stepped structure 162. The second stepped structure 162 is configured to change a far field light intensity distribution. The second stepped structure 162 is configured to apply a desired phase difference in the third region 173 and the fourth region 174. Because the second stepped structure 162 is formed on an upper part of the first stepped structure 160 as illustrated in FIG. 1, the second stepped structure 162 inherits the level difference between the first region 171 and the second region 172 of the first stepped structure 160. As a result, a bottom surface and an upper surface can be deviated between the first region 171 and the second region 172 also in the second stepped structure 162.

As illustrated in FIG. 3A, in the second stepped structure 162, the optical thickness of a dielectric material 302 in the third region 173 may be increased compared with that in the fourth region 174. Conversely, as illustrated in FIG. 3B, in the second stepped structure 162, the optical thickness of a dielectric material 304 in the third region 173 may be reduced compared with that in the fourth region 174.

The optical thickness of the second stepped structure 162 in the third region 173 and the fourth region 174 is λ/2 or an integral multiple thereof, for example. In this case, a change in the reflectance by the second stepped structure 162 can be suppressed. Specifically, only the first stepped structure applies a reflectance difference, and the second stepped structure is used to change the far field light intensity distribution. Thereby, the design can be simplified.

The optical thickness of the third region 173 increases a light path length difference between the third region 173 and the fourth region 174 in the second stepped structure 162 and an environmental medium, to obtain a desired transmitted light phase difference. The transmitted light phase difference is advantageously more than π/2. When the stepped structure has a tapered shape, the phase difference is further increased. For example, the transmitted light phase difference is more than π or 3π/2.

The second stepped structure 162 illustrated in FIG. 3A includes, for example, $SiO_2$ having a refractive index of 1.5. The optical thickness of the fourth region 174 is 0.5λ. The optical thickness of the third region 173 (first region 171) is 1.5λ to 2.0λ, for example, 2.0λ.

The second stepped structure 162 illustrated in FIG. 3B includes, for example, $SiO_2$ having a refractive index of 1.5. The optical thickness of the fourth region 174 is, for example, 1.5λ or 2.0λ. The optical thickness of the third region 173 (first region 171) is, for example, 0.5λ.

Figure 7:
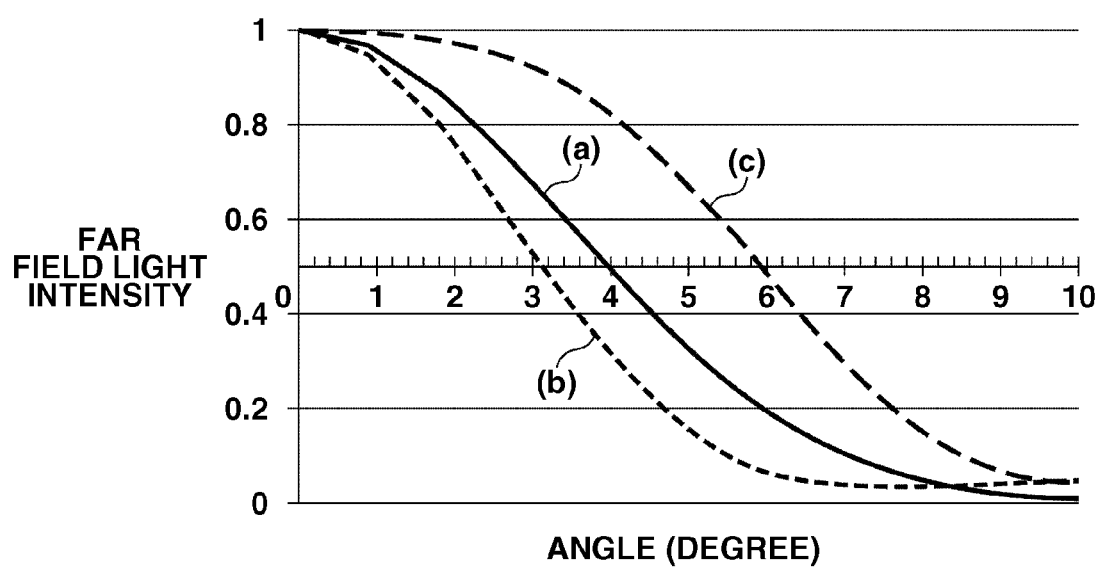
FIG. 7 illustrates a far field light intensity distribution of the surface emitting laser according to the first exemplary embodiment.

The example of the calculation result of the far field light intensity of the surface emitting laser 100 of the first exemplary embodiment is illustrated in FIG. 7. The horizontal axis in the graph of FIG. 7 represents a divergence angle of laser light. The vertical axis thereof represents the far field light intensity, which is normalized by intensity in an optical axis direction.

Three curves in the graph represent the following three cases (A) to (C): (A) both the first stepped structure 160 and the second stepped structure 162 do not exist; (B) only the first stepped structure 160 exists; and (C) the first stepped structure 160 and the second stepped structure 162 exist. The comparison of these curves shows that the far field light intensity distribution thinned by the first stepped structure can be spread by the second stepped structure and the light intensity distribution can be flattened near the center.

Herein, a circular current confinement region having a diameter of 5.2 μm is formed by the oxidization region 142 in the surface emitting laser 100 oscillated at λ=680 nm. The first stepped structure 160 includes a semiconductor having a refractive index of 3.4. The optical thickness thereof is λ/2 in the first region 171, and is λ/4 in the second region 172. The first stepped structure 160 applies a transmittance ratio of 16 times between the first region 171 and the second region 172.

The first region 171 has a center coaxial to that of the current confinement region, and has a circular shape having a diameter of 3.7 μm.

The second stepped structure 162 includes a dielectric material having a refractive index of 1.5. The optical thickness thereof is 2λ in the third region 173, and is λ/2 in the fourth region 174. The second stepped structure 162 does not apply a reflectance distribution. The third region 173 has a center coaxial to that of the current confinement region, and has a circular shape having a diameter of 4.8 μm.

A producing method will be described. A lower mirror 120, an active layer 130, and an upper mirror 140 are grown on a substrate 110 using an MOCVD method. A semiconductor layer which is a first stepped structure 160 is formed. The semiconductor layer which is the first stepped structure 160, the upper mirror 140, and the active layer 130 are etched in a mesa shape using a dry etching method. A region which becomes a first region 171 or a second region 172 is etched by a desired thickness to form the first stepped structure 160. A self-alignment process configured to perform simultaneous etching may be used to form the mesa and the first stepped structure 160. A dielectric material is formed on an upper part of the mesa and the side wall of the mesa using a plasma CVD method. A region which becomes the first region 171 and a third region 173 or a fourth region 174 is etched by a desired thickness. A dielectric material film is further formed on the upper part of the mesa if necessary to form a second stepped structure 162. A lift-off method may be used to form the second stepped structure 162. A part of a dielectric material layer on the upper surface of the mesa is etched so that an upper electrode 152 and the semiconductor layer can be brought into contact with each other. The upper electrode 152 is formed by an electron beam vapor-deposition method or a resistance heating vapor-deposition method using the lift-off method. A lower electrode 150 is similarly formed on the lower surface of the substrate 110.

A second exemplary embodiment will be described. In a surface emitting laser 400 of the second exemplary embodiment, the order of lamination of a first stepped structure 460 and a second stepped structure 462 on an upper mirror 140 is different from that of the surface emitting laser 100 of the first exemplary embodiment. The second stepped structure 162 of the first exemplary embodiment includes the dielectric material. The second stepped structure 462 of the second exemplary embodiment is different from the second stepped structure 462 of the first exemplary embodiment in that the second stepped structure 462 includes a semiconductor.

Figure 4:
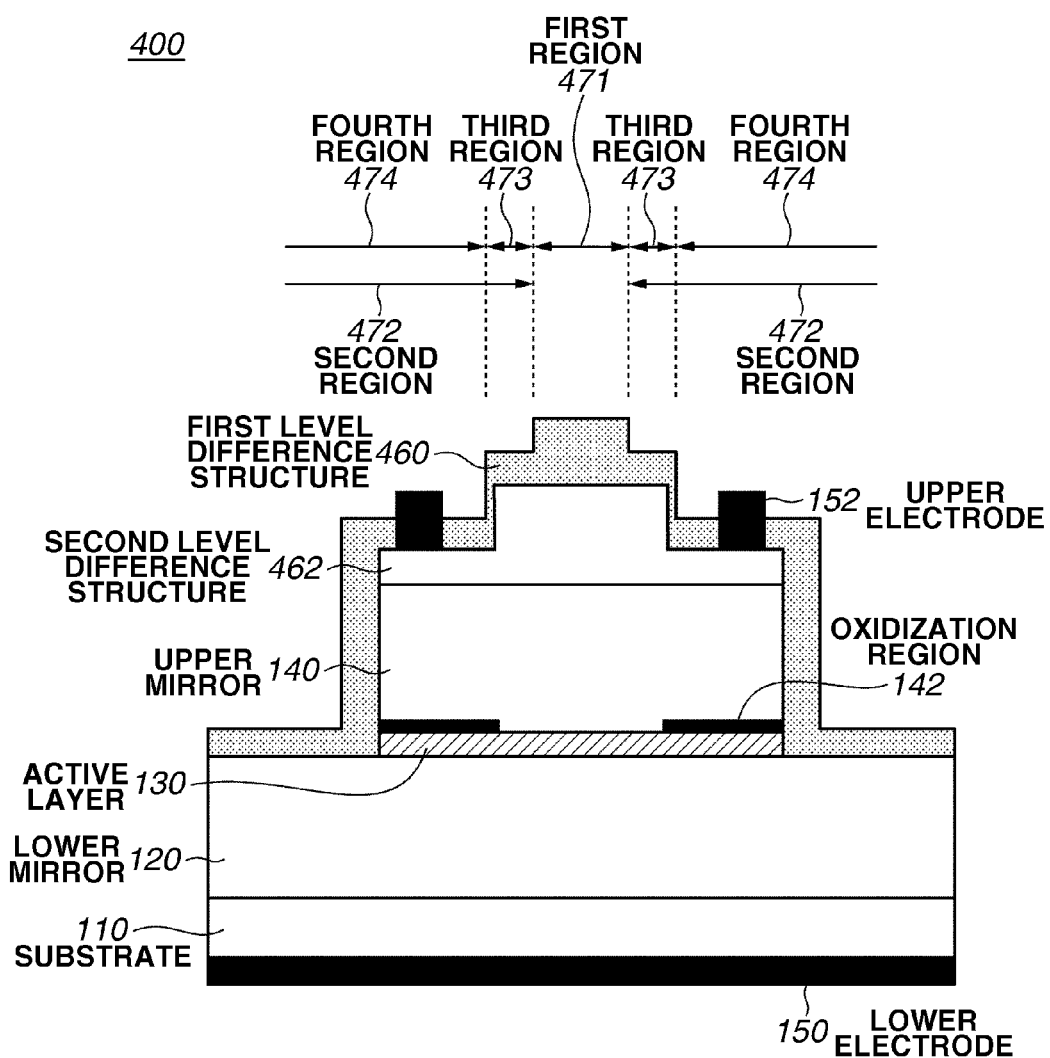
FIG. 4 is a schematic cross sectional view of a surface emitting laser according to a second exemplary embodiment.

The schematic cross sectional view of the surface emitting laser 400 is illustrated in FIG. 4. The second stepped structure 462 including a semiconductor is provided on the upper mirror 140 of the surface emitting laser 400. The first stepped structure 460 including a dielectric material is provided on an upper part of the second stepped structure 462.

A first material included in the first stepped structure 460 has a refractive index lower than that of a second material included in the second stepped structure 462. For example, the refractive index of the first material is 1.0 to 2.5, and the refractive index of the second material is 2.5 to 4.0.

The first stepped structure 460 makes the reflectance of a first region 471 higher than that of a second region 472 as is the case with the first stepped structure 160 of the first exemplary embodiment.

The second stepped structure 462 applies a large transmitted light phase difference between a third region 473 and a fourth region 474 as is the case with the second stepped structure 162 of the first exemplary embodiment, to deform a far visual field light intensity distribution.

FIGS. 5A to 5F are schematic cross sectional views illustrating the first stepped structure 460 of the surface emitting laser 400 according to the second exemplary embodiment. Adamantly, FIGS. 5A to 5F are schematic views as is the case with FIGS. 3A and 3B. Therefore, when the first stepped structure 460 is formed on the second stepped structure 462, the shape of the first stepped structure 460 inherits the level difference of the second stepped structure 462. As a result, also in the first stepped structure 460, a bottom surface and an upper surface can be deviated between the third region 473 and the fourth region 474.

Figure 5A:
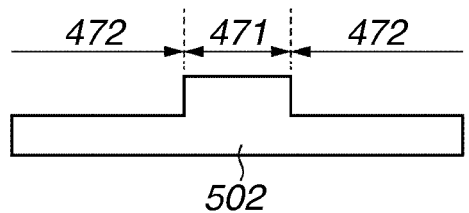
FIGS. 5A, 5B, 5C, 5D, 5E, and 5F are schematic cross sectional views of a first stepped structure included in the surface emitting laser according to the second exemplary embodiment.
Figure 5B:
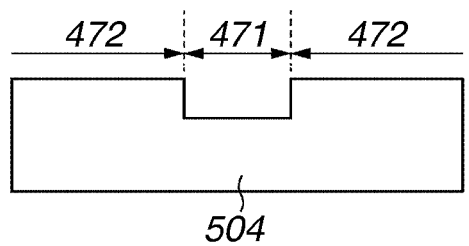
Figure 5C:
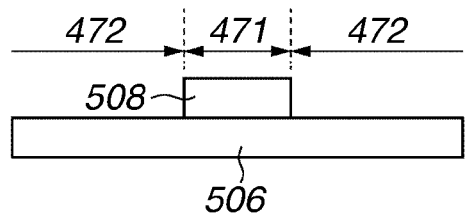
Figure 5D:
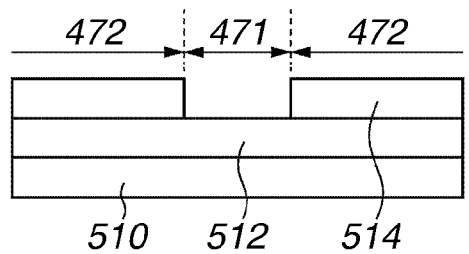
Figure 5E:
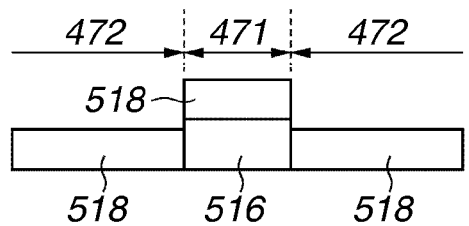
Figure 5F:
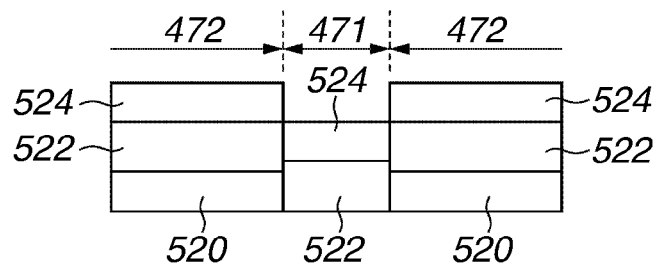

The shape of the first stepped structure 460 may be, for example, a convex type as illustrated in FIGS. 5A, 5C, and 5E, or may be a concave type as illustrated in FIGS. 5B, 5D, and 5F.

In FIG. 5A, the optical thickness of a member 502 included in the first stepped structure 460 is $\lambda/2$ in the first region 471, and $\lambda/4$ in the second region 472.

The optical thickness of a member 504 included in the first stepped structure 460 in FIG. 5B is $\lambda/2$ in the first region 471, and is $3\lambda/4$ in the second region 472.

In FIG. 5C, the first stepped structure 460 includes members 506 and 508 including different materials. The member 508 having an optical thickness of $\lambda/4$ is formed in only the first region 471 on an upper part of the member 506 having an optical thickness $\lambda/4$. In the viewpoint of making the reflectance of the first region 471 higher than the reflectance of the second region 472, the refractive index of the member 508 is advantageously higher than that of the member 506.

In FIG. 5D, the first stepped structure 460 includes members 510, 512, and 514 including different materials. The members 510 and 514 may be the same. The member 512 having an optical thickness $\lambda/4$ is formed on an upper part of the member 510 having an optical thickness $\lambda/4$. The member 514 having an optical thickness of $\lambda/4$ is formed in only the second region 472 on an upper part of the member 512. In the viewpoint of making the reflectance of the first region 471 higher than the reflectance of the second region 472, the refractive index of the member 512 is advantageously higher than those of the member 510 and the member 514.

In FIG. 5E, the first stepped structure 460 includes members 516 and 518 including different materials. The member 516 having an optical thickness $\lambda/4$ is formed in only the first region 471. The member 518 having an optical thickness $\lambda/4$ is formed so as to cover the member 516 in the first region 471 and the second region 472. In the viewpoint of making the reflectance of the first region higher than the reflectance of the second region, the refractive index of the member 518 is advantageously higher than that of the member 516.

In FIG. 5F, the first stepped structure 460 includes members 520, 522, and 524 having different materials. The members 520 and 524 may be the same. The member 520 having an optical thickness $\lambda/4$ is formed in only the second region 472. The member 522 and the member 524 having an optical thickness $\lambda/4$ are formed so as to cover the member 520 in the first region 471 and the second region 472. In the viewpoint of making the reflectance of the first region higher than the reflectance of the second region, the refractive indexes of the members 520 and 524 is advantageously higher than that of the member 522.

The first stepped structure 460 includes an dielectric material such as silicon oxide having a refractive index of about 1.5 or silicon nitride having a refractive index of about 2.0.

Figure 6A:
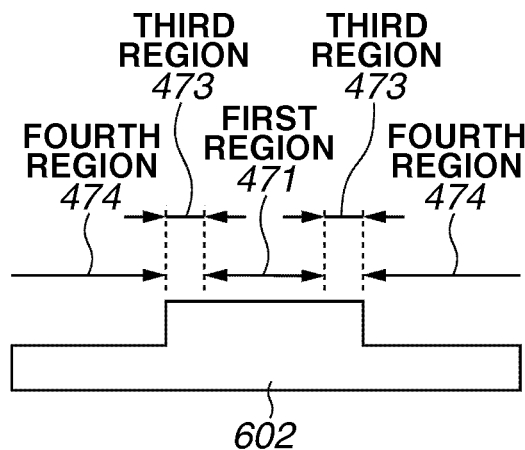
FIGS. 6A and 6B are schematic cross sectional views of a second stepped structure included in the surface emitting laser according to the second exemplary embodiment.
Figure 6B:
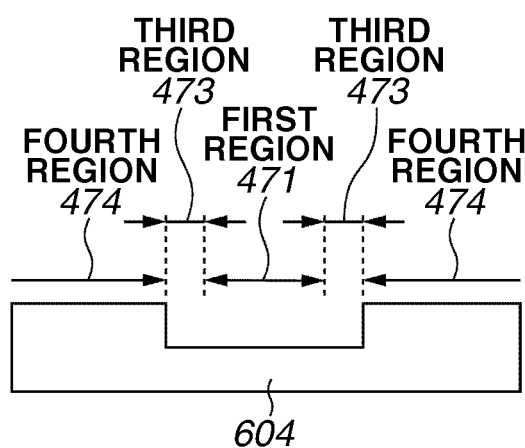

FIGS. 6A and 6B are schematic cross sectional views illustrating the second stepped structure 462 of the surface emitting laser 400 according to the second exemplary embodiment. In the second stepped structure 462, the optical thickness in the third region 473 is different from that in the fourth region 474. The shape of the second stepped structure 462 may be a convex type as illustrated in FIG. 6A, or may be a concave type as illustrated in FIG. 6B.

It is useful that the reflectance distribution of the whole upper mirror is not affected by reflection on the interface between the second stepped structure 462 and a first stepped structure 460 formed on an upper part of the second stepped structure 462. Therefore, the optical thickness of the second stepped structure 462 is advantageously an integral multiple of $\lambda/2$.

The optical thickness of a member 602 as the second stepped structure 462 illustrated in FIG. 6A is, for example, $2\lambda$ in the third region 473, and is $\lambda/2$ in the fourth region 474. The optical thickness of a member 604 as the second stepped structure 462 illustrated in FIG. 6B is, for example, $\lambda/2$ in the third region 473, and is $2\lambda$ in the fourth region 474.

The second stepped structure 462 may include a single material, or may include a plurality of materials. The second stepped structure 462 includes a semiconducting material, for example, AlGaAs. In order to form these structures by etching, an etching stop layer such as GaAs or AlGaInP may also be inserted into the interface stopping the etching.

In the surface emitting laser 400 according to the second exemplary embodiment, the actual thickness of the second stepped structure 462 is suppressed compared with the surface emitting laser 100 according to the first exemplary embodiment, and the production accuracy of the surface emitting laser 400 is enhanced. Specifically, because the second stepped structure 462 is designed to apply a large phase difference to the transmitted light, it is necessary to increase an absolute value of a value obtained by subtracting an actual thickness difference from a light path length difference. Therefore, it is advantageous that the second stepped structure 462 includes a material having a high refractive index in that the actual thickness is suppressed. Specifically, in this point, the surface emitting laser 400 according to the second exemplary embodiment in which the second stepped structure 462 includes a semiconductor is superior to the surface emitting laser 100 according to the first exemplary embodiment in which the second stepped structure 162 includes a dielectric material.

The stepped structure of the semiconductor has the advantage of easily matching the stepped structure to the center of an oxidization region 142 in a horizontal direction. This is because the stepped structure of the semiconductor can be formed using a self-alignment process during mesa etching formation. Therefore, the semiconductor is advantageous as a material of the second stepped structure 462 in which a position displacement between the centrals of the level difference and the oxidization region 142 has a large influence on a far field.

On the other hand, because a film having a thickness controlled on the already existing level difference can be formed in the stepped structure by the dielectric material, a structure having a large reflectance difference can be formed as illustrated in FIGS. 5E and 5F. Specifically, a dielectric material can be used as a material of the first stepped structure 460 formed on the second stepped structure 462.

The material and the structure of the first stepped structure 460 or the second stepped structure 462 are not limited to those of the first exemplary embodiment and the second exemplary embodiment, and various changes can be made within the scope of the present invention.

A third exemplary embodiment will be described. An image forming apparatus using a surface emitting laser array light source in which the plurality of surface emitting lasers described above are arranged will be described with reference to FIGS. 8A and 8B.

Figure 8A:
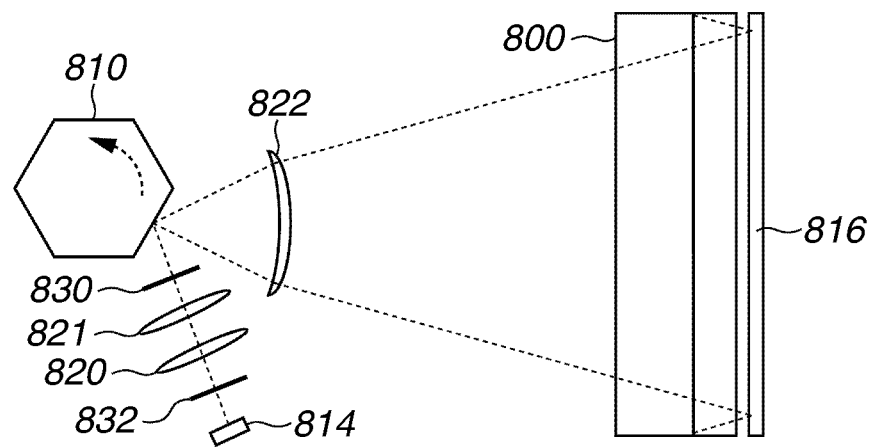
FIGS. 8A and 8B are schematic views of an image forming apparatus according to a third exemplary embodiment.
Figure 8B:
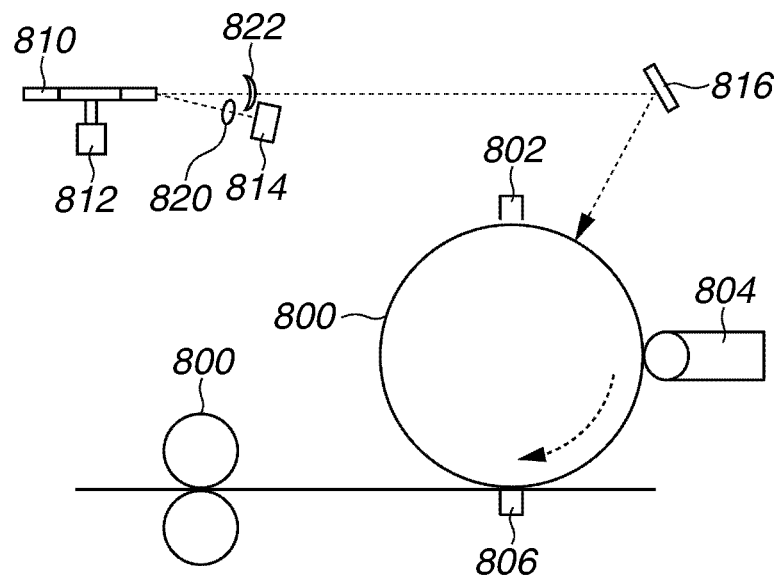
Figure 9:
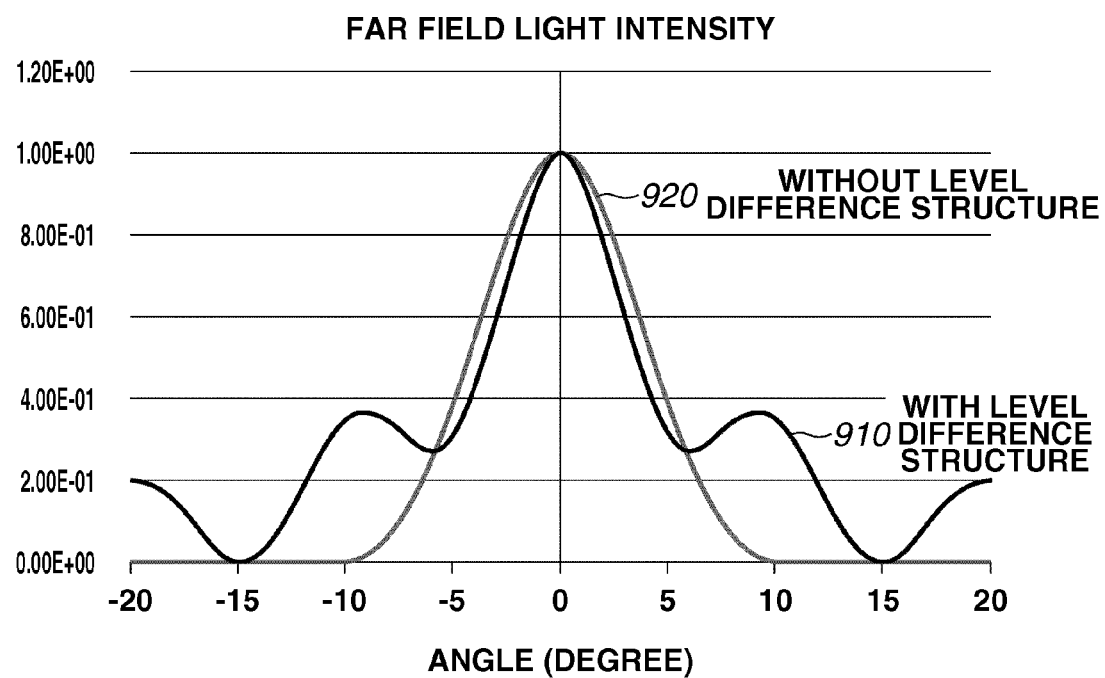
FIG. 9 illustrates far visual field light intensity distributions of a surface emitting laser having a stepped structure and a surface emitting laser without having stepped structure.

FIG. 8A is a plan view of the image forming apparatus, and FIG. 8B is a side view of the apparatus.

Laser light output from a surface emitting laser array light source 814 used as a recording light source is irradiated to a rotation multiple mirror 810 rotatably driven by a motor 812 via a subscanning diaphragm 832, a collimator lens 820, a cylindrical lens 821, and a main scanning diaphragm 830.

The laser light irradiated to the rotation multiple mirror 810 is reflected as a deflection beam having an outgoing angle continuously changed with the rotation of the rotation multiple mirror 810. The reflected light is subjected to correction of distortion aberration by an f-θ lens 822, and is irradiated to a photosensitive member 800 through a reflector 816.

The photosensitive member 800 is previously charged by a charging unit 802. The photoreceptor 800 is sequentially exposed by the scanning of the laser light, to form an electrostatic latent image. The electrostatic latent image formed on the photoreceptor 800 is developed by the developing unit 804. The developed visible image is transferred onto a transfer paper by a transfer charging unit 806. The transfer paper onto which the visible image is transferred is fed to a fixing unit 808. After the transfer paper is subjected to fixing, the transfer paper is discharged to the outside of the apparatus.

The surface emitting laser and the surface emitting laser array in the specification may be used as a light source for other optical apparatus such as a display and a medical apparatus.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-212969 filed Sep. 28, 2011, which is hereby incorporated by reference herein in its entirety.

What is claimed is:

1. A surface emitting laser including a laminated structure including a substrate, and a lower mirror, an active layer, and an upper mirror formed on the substrate configured to oscillate at a wavelength λ, the surface emitting laser comprising:
   a first stepped structure provided in a light outgoing region on an upper part of the upper mirror and including a level difference formed between a first region arranged in a center portion of the light outgoing region and a second region provided outside the first region; and
   a second stepped structure provided in the light outgoing region on the upper part of the upper mirror and including a level difference formed between a third region provided outside the first region and a fourth region provided outside the third region,
   wherein the level difference of the second stepped structure exists in the second region;
   reflectance of a structure including the upper mirror, the first stepped structure, and the second stepped structure in the first region is higher than that in the second region with respect to light perpendicularly made incident to the substrate and having a wavelength λ; and
   a phase difference between transmitted light of the third region and transmitted light of the fourth region is greater than a phase difference between transmitted light of the first region and transmitted light of the third region and wherein phase difference between transmitted light of the third region and transmitted light of the fourth region is π.

2. The surface emitting laser according to claim 1, wherein an absolute value of a value obtained by subtracting an actual thickness difference between the third region and the fourth region concerning the second stepped structure from a light path length difference therebetween is greater than an absolute value of a value obtained by subtracting an actual thickness difference between the first region and the third region concerning the first stepped structure from a light path length difference therebetween.

3. The surface emitting laser according to claim 1, wherein the first stepped structure includes a first material through which at least a part of light having a wavelength λ is transmitted, and
   wherein the second stepped structure includes a second material through which at least a part of the light having the wavelength λ is transmitted.

4. The surface emitting laser according to claim 3, wherein the first material has a refractive index different from that of the second material.

5. The surface emitting laser according to claim 3, wherein the first material is a semiconductor, and
   wherein the second material is a dielectric material.

6. The surface emitting laser according to claim 3, wherein the first material is a dielectric material, and
   wherein the second material is a semiconductor.

7. The surface emitting laser according to claim 5, wherein the semiconductor includes AlGaAs.

8. The surface emitting laser according to claim 5, wherein the dielectric material includes silicon oxide or silicon nitride.

9. The surface emitting laser according to claim 1, wherein a difference between an optical thickness of the first region and an optical thickness of the second region is an odd multiple of λ/4 in the first stepped structure.

10. The surface emitting laser according to claim 9, wherein the difference between the optical thickness of the first region and the optical thickness of the second region is λ/4 in the first stepped structure.

11. The surface emitting laser according to claim 1, wherein the phase difference between the transmitted light of the third region and the transmitted light of the fourth region is greater than π/2.

12. The surface emitting laser according to claim 1, wherein the phase difference between the transmitted light of the third region and the transmitted light of the fourth region is greater than π/2 and less than 3π/2.

13. An image forming apparatus comprising:
   a surface emitting laser array in which a plurality of surface emitting lasers according to claim 1 are arranged;
   a photosensitive member configured to form an electrostatic latent image by light from the surface emitting laser array;
   a charging unit configured to charge the photosensitive member; and
   a developing unit configured to develop the electrostatic latent image.

* * * * *